United States Patent
Hasegawa et al.

(10) Patent No.: US 10,276,731 B2
(45) Date of Patent: Apr. 30, 2019

(54) SCHOTTKY BARRIER DIODE

(71) Applicant: TOYODA GOSEI CO., LTD., Kiyosu-shi (JP)

(72) Inventors: Kazuya Hasegawa, Kiyosu (JP); Tohru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/916,813

(22) Filed: Mar. 9, 2018

(65) Prior Publication Data

US 2018/0269335 A1    Sep. 20, 2018

(30) Foreign Application Priority Data

Mar. 16, 2017 (JP) .................. 2017-050674
Mar. 1, 2018 (JP) .................. 2018-036342

(51) Int. Cl.
*H01L 29/872* (2006.01)
*H01L 29/66* (2006.01)
*H01L 29/20* (2006.01)
*H01L 21/04* (2006.01)
*H01L 29/47* (2006.01)

(52) U.S. Cl.
CPC ........ *H01L 29/872* (2013.01); *H01L 21/0495* (2013.01); *H01L 29/2003* (2013.01); *H01L 29/47* (2013.01); *H01L 29/66143* (2013.01)

(58) Field of Classification Search
CPC ............... H01L 29/872; H01L 21/0495; H01L 29/2003
See application file for complete search history.

(56) References Cited

U.S. PATENT DOCUMENTS

2004/0061195 A1*  4/2004  Okada ................. H01L 27/0814
                                                257/477
2012/0223337 A1   9/2012  Terano et al.
2013/0105820 A1   5/2013  Konishi et al.
2015/0333190 A1  11/2015  Aketa et al.

FOREIGN PATENT DOCUMENTS

| JP | 2010-192555 A | 9/2010 |
| JP | 2012-186239 A | 9/2012 |
| JP | 2013-098268 A | 5/2013 |
| JP | 2014-116471 A | 6/2014 |

\* cited by examiner

*Primary Examiner* — Errol V Fernandes
(74) *Attorney, Agent, or Firm* — McGinn I.P. Law. Group PLLC.

(57) ABSTRACT

A Schottky barrier diode comprises a semiconductor layer configured to include a surface and a plurality of recesses that are recessed relative to the surface; and a Schottky electrode arranged to form a Schottky contact with the surface. When the semiconductor layer is viewed from a surface side thereof, the surface is arranged continuously, and distances on the surface between adjacent recesses are substantially identical. This configuration suppresses a photoresist from being left in any unintended portion.

20 Claims, 20 Drawing Sheets

OPENING OF PHOTORESIST    SURFACE OF SEMICONDUCTOR LAYER

SCHOTTKY BARRIER DIODE

CROSS-REFERENCE TO RELATED APPLICATION

This application claims priority to Japanese Patent Application No. 2017-050674 filed on Mar. 16, 2017 and Japanese Patent Application No. 2018-036342 filed on Mar. 1, 2018, the entire contents of which are incorporated by reference herein.

BACKGROUND

Technical Field

The disclosure relates to a Schottky barrier diode.

Related Art

A Schottky barrier diode (SBD) is one of known semiconductor devices (as described in, for example, JP 2014-116471A). In the Schottky barrier diode, when a reverse voltage is applied, leak current is likely to increase due to concentration of an electric field at an end of a Schottky contact.

In the Schottky barrier diode described in JP 2014-116471A, as shown in FIG. 20, for the purpose of suppressing an increase in leak current at a reverse voltage, trenches 210 are formed, and a surface G of a semiconductor layer 200 surrounded by the trench 210 is formed in a rectangular shape with two semicircular opposed short sides. JP 2010-192555A, JP 2013-098268A and JP 2012-186239A disclose different configurations of trenches and a semiconductor layer.

Employing the structure with such ends of the semiconductor layer described in JP 2014-116471A, however, has a problem that a photoresist is left in an unintended portion by photolithography performed in the process of formation of electrodes after formation of the trenches. Light entering the semiconductor layer is refracted and reflected to cause interference of light in the course of exposure in photolithography. The photoresist is also likely to be exposed to the light even in portions shielded from the light by a photo mask. There is accordingly a need for a technique that suppresses a photoresist from being left in any unintended portion.

SUMMARY

In order to solve at least part of the problems described above, the disclosure may be implemented by aspects described below.

(1) According to one aspect of the present disclosure, there is provided a Schottky barrier diode. This Schottky barrier diode comprises a semiconductor layer configured to include a surface and a plurality of recesses that are recessed relative to the surface; and a Schottky electrode arranged to form a Schottky contact with the surface. When the semiconductor layer is viewed from a surface side thereof, the surface is arranged continuously, and distances on the surface between adjacent recesses are substantially identical. In the Schottky barrier diode of this aspect, the distances on the surface between adjacent recesses are substantially identical. This configuration suppresses a photoresist from being left in any unintended portion.

(2) In the Schottky barrier diode of the above aspect, when the semiconductor layer is viewed from the surface side, the recess surrounded by the surface may be formed in a circular shape or in a four-side shape with two semicircular opposed sides. The Schottky barrier diode of this aspect suppresses a photoresist from being left in any unintended portion.

(3) In the Schottky barrier diode of the above aspect, when the semiconductor layer is viewed from the surface side, the recess surrounded by the surface may be formed in a hexagonal shape. The Schottky barrier diode of this aspect suppresses a photoresist from being left in any unintended portion.

(4) In the Schottky barrier diode of the above aspect, when the semiconductor layer is viewed from the surface side, centers of multiple recesses surrounded by the surface may be arrayed in a rhombic lattice arrangement. The Schottky barrier diode of this aspect reduces the on-resistance.

(5) In the Schottky barrier diode of the above aspect, when the semiconductor layer is viewed from the surface side, multiple recesses surrounded by the surface may be parallel to each other in a first direction and may be arrayed in a line in a second direction perpendicular to the first direction. The Schottky barrier diode of this aspect suppresses a photoresist from being left in any unintended portion.

(6) In the Schottky barrier diode of the above aspect, the distance on the surface between adjacent recesses may be not less than 1.0 μm and not greater than 15 μm. The Schottky barrier diode of this aspect reduces the field intensity.

(7) In the Schottky barrier diode of the above aspect, an angle between a bottom face and a side wall of the recess may be not less than 85 degrees and not greater than 90 degrees. The Schottky barrier diode of this aspect suppresses a photoresist from being left in any unintended portion.

(8) In the Schottky barrier diode of the above aspect, the recesses may have a depth of not less than 0.1 μm and not greater than 5.0 μm. The Schottky barrier diode of this aspect reduces the field intensity.

(9) In the Schottky barrier diode of the above aspect, a distance between an end of the Schottky electrode and a side wall of the recess may be not greater than 2.0 μm. The Schottky barrier diode of this aspect reduces the field intensity.

(10) In the Schottky barrier diode of the above aspect, the Schottky electrode may be made of at least one selected from a group consisting of nickel, palladium, platinum and iridium. The Schottky barrier diode of this aspect reduces the reverse current.

(11) In the Schottky barrier diode of the above aspect, the semiconductor layer may be made of gallium nitride. The Schottky barrier diode of this aspect improves the breakdown voltage.

The disclosure may be implemented by any of various aspects other than the Schottky barrier diode, for example, a manufacturing method of the Schottky barrier diode and an apparatus for manufacturing the Schottky barrier diode using the manufacturing method.

The configuration of the Schottky barrier diode according to any of the above aspects suppresses a photoresist from being left in any unintended portion.

DESCRIPTION OF EMBODIMENTS

A. First Embodiment

A-1. Configuration of Semiconductor Device

Figure 1:
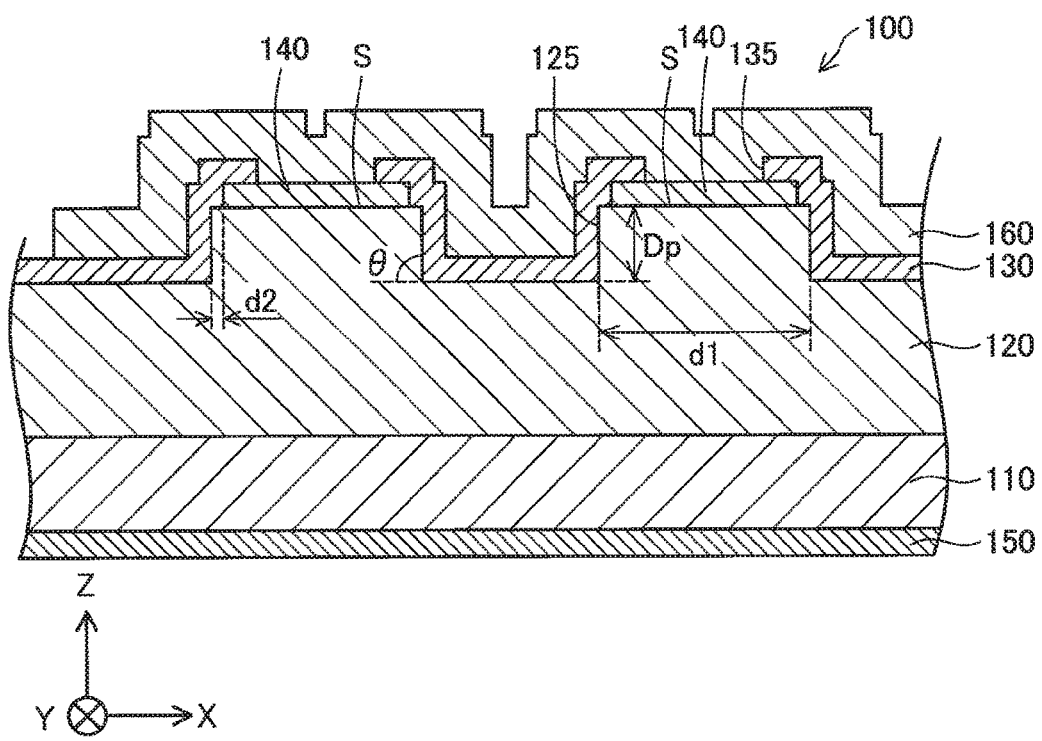
FIG. 1 is a sectional view schematically illustrating the configuration of a semiconductor device according to a first embodiment.

FIG. 1 is a sectional view schematically illustrating the configuration of a semiconductor device 100 according to a first embodiment. The semiconductor device 100 is a GaN-based semiconductor device formed by using gallium nitride (GaN). The semiconductor device 100 is a vertical Schottky barrier diode. According to the embodiment, the semiconductor device 100 is used for power control and is also called power device.

X, Y and Z axes orthogonal to one another are illustrated in FIG. 1. Among the X, Y and Z axes shown in FIG. 1, the X axis is an axis extended from left to right of the sheet surface of FIG. 1. A +X-axis direction is a rightward direction of the sheet surface, and a −X-axis direction is a leftward direction of the sheet surface. Among the X, Y and Z axes shown in FIG. 1, the Y axis is an axis extended from front to back of the sheet surface of FIG. 1. A +Y-axis direction is a rearward direction of the sheet surface, and a −Y-axis direction is a forward direction of the sheet surface. Among the X, Y and Z axes shown in FIG. 1, the Z axis is an axis extended from bottom to top of the sheet surface of FIG. 1. A +Z-axis direction is an upward direction of the sheet surface, and a −Z-axis direction is a downward direction of the sheet surface.

The semiconductor device 100 includes a substrate 110, a semiconductor layer 120, an insulating film 130, Schottky electrodes 140, a cathode electrode 150 and a wiring electrode 160.

The substrate 110 and the semiconductor layer 120 of the semiconductor device 100 are plate-like semiconductors that are extended along the X axis and the Y axis. The substrate 110 and the semiconductor layer 120 are n-type semiconductor layers, and the semiconductor layer 120 is formed on the substrate 110. According to the embodiment, the substrate 110 and the semiconductor layer 120 are made of a group III nitride semiconductor. Examples of the group III nitride semiconductor include gallium nitride (GaN), aluminum nitride (AlN), aluminum gallium nitride (AlGaN), indium gallium nitride (InGaN) and indium aluminum gallium nitride (InAlGaN). In terms of using the group III nitride semiconductor for the semiconductor device for power control, gallium nitride (GaN) and aluminum gallium nitride (AlGaN) are preferable as the group III nitride semiconductor. This embodiment uses gallium nitride (GaN) as the group III nitride semiconductor. Within a range that ensures the advantageous effects of the embodiment, the group III nitride semiconductor may include another group III element such as aluminum (Al) or indium (In) by substitution of part of gallium nitride (GaN) or may include another impurity.

Figure 2:
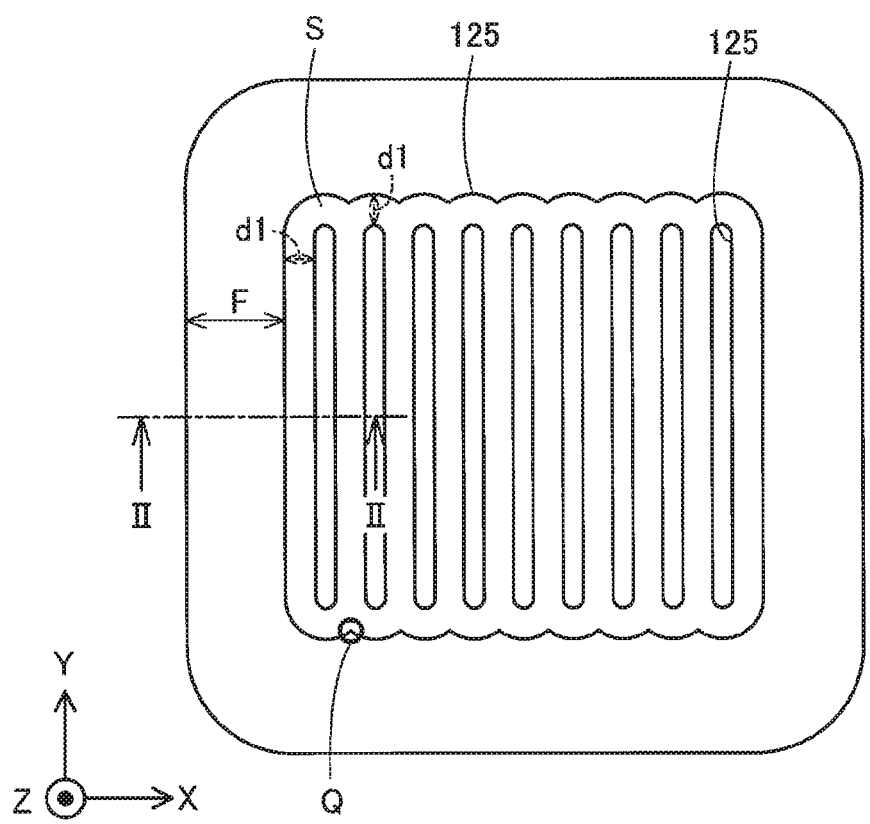
FIG. 2 is a diagram illustrating the configuration of recesses when a semiconductor layer is viewed from its surface side.

FIG. 2 is a diagram illustrating the configuration of recesses 125 when the semiconductor layer 120 is viewed from a surface S-side. A II-II section of FIG. 2 corresponds to the section shown in FIG. 1. As shown in FIG. 2, the semiconductor layer 120 has a surface (+Z-axis direction side face) S and a plurality of recesses 125 that are recessed relative to the surface S. In other words, the surface S is a portion protruded from the recesses 125. When the semiconductor layer 120 is viewed from the surface S-side, the surface S of the semiconductor layer 120 is arranged continuously in an endless manner.

Each of the recesses 125 surrounded by the surface S is formed in a four-side shape with two semicircular opposed sides. In other words, the recess 125 surrounded by the surface S is formed in a long rod-like shape having rounded semicircular ends. More specifically, the recess 125 surrounded by the surface S is formed in a rectangular shape with two semicircular opposed short sides. This configuration chamfers portions that are in the plane of the surface S and form side faces of the recesses 125 and accordingly provides a smooth distribution of electrostatic potential in application of a reverse voltage. As a result, this configuration suppresses an increase in leak current at a reverse voltage. The plurality of recesses 125 surrounded by the surface S are parallel to each other in a first direction and are arrayed in a line in a second direction perpendicular to the first direction.

The recesses 125 are formed such that distances d1 between adjacent recesses 125 are substantially identical. In order to give substantially identical distances d1 between adjacent recesses 125, the side walls of a recess 125 located on the outer periphery of the surface S have bends Q that are bent to make the distance d1 between adjacent recesses 125. A region F of the recess 125 located on the outer periphery of the surface S denotes a terminal region where a terminal structure of the semiconductor device 100 is formed. An element region denotes a region that is surrounded by the terminal region and where the surface S is located. The state that the distances d1 are substantially identical" means that the distance d1 is allowed to have a difference within 10%.

According to the embodiment, the distance d1 on the surface S between the adjacent recesses 125 is 6 µm. In terms of reducing the field intensity, the distance d1 is preferably not greater than 15 µm, is more preferably not greater than 10 µm, and is furthermore preferably not greater than 6 µm. In terms of maintaining the processing accuracy, the distance d1 is preferably not less than 1 µm and is more preferably not less than 2 µm.

An angle θ between the bottom face and the side wall of the recess 125 (shown in FIG. 1) is preferably not less than 85 degrees and not greater than 90 degrees. The angle θ of not less than 85 degrees effectively suppresses a photoresist from being left in any unintended portion by photolithography in a subsequent electrode formation process. According to this embodiment, the angle θ is 90 degrees.

A depth Dp of the recess 125 is preferably not less than 0.1 µm, is more preferably not less than 1.0 µm and is furthermore preferably not less than 2.0 µm, in terms of reducing the field intensity. In terms of maintaining the processing accuracy, the depth Dp is preferably not greater than 5.0 µm. The "depth Dp of the recess 125" denotes a distance from the surface S of the semiconductor layer 120 to the bottom face of the recess 125 in the stacking direction (Z-axis direction) of the substrate 110 and the semiconductor layer 120.

The Schottky electrode 140 of the semiconductor device 100 is an anode electrode that is formed on the surface S of the semiconductor layer 120 and that forms a Schottky contact with the surface S. According to the embodiment, the Schottky electrode 140 is made of at least one selected from the group consisting of nickel (Ni), palladium (Pd), platinum (Pt) and iridium (Ir). According to the embodiment, the Schottky electrode 140 is provided by forming a layer made of nickel (Ni) and a layer made of palladium (Pd) in this sequence on the surface S of the semiconductor layer 120. A distance d2 between an end of the Schottky electrode 140 and the side wall of the recess 125 is preferably not greater than 2.0 µm, in terms of reducing the field intensity.

The insulating film 130 of the semiconductor device 100 is a film that has electrical insulating properties and is arranged to cover the recesses 125 formed in the semiconductor layer 120 and to cover part of the surface S of the semiconductor layer 120 and part of each of the Schottky electrodes 140. The insulating film 130 has openings 135. Each of the openings 135 is provided to cause part of the Schottky electrode 140 to be exposed. The wiring electrode 160 is formed on the insulating film 130 and is arranged to adjoin the Schottky electrodes 140 in the openings 135 of the insulating film 130. In terms of suppressing dielectric breakdown of the insulating film 130, the insulating film 130 has a thickness of preferably not less than 50 nm, more preferably not less than 100 nm and furthermore preferably not less than 200 nm. In terms of reducing the field intensity, the thickness of the insulating film 130 is preferably not greater than 1000 nm.

The cathode electrode 150 of the semiconductor device 100 is a rear face electrode that is formed on an opposite side face to the side of the substrate 110 where the semiconductor layer 120 is formed. According to the embodiment, the cathode electrode 150 is formed on a −Z-axis direction side face of the substrate 110. The cathode electrode 150 is arranged to be in ohmic contact with the substrate 110.

A-2. Manufacturing Method of Semiconductor Device

Figure 3:
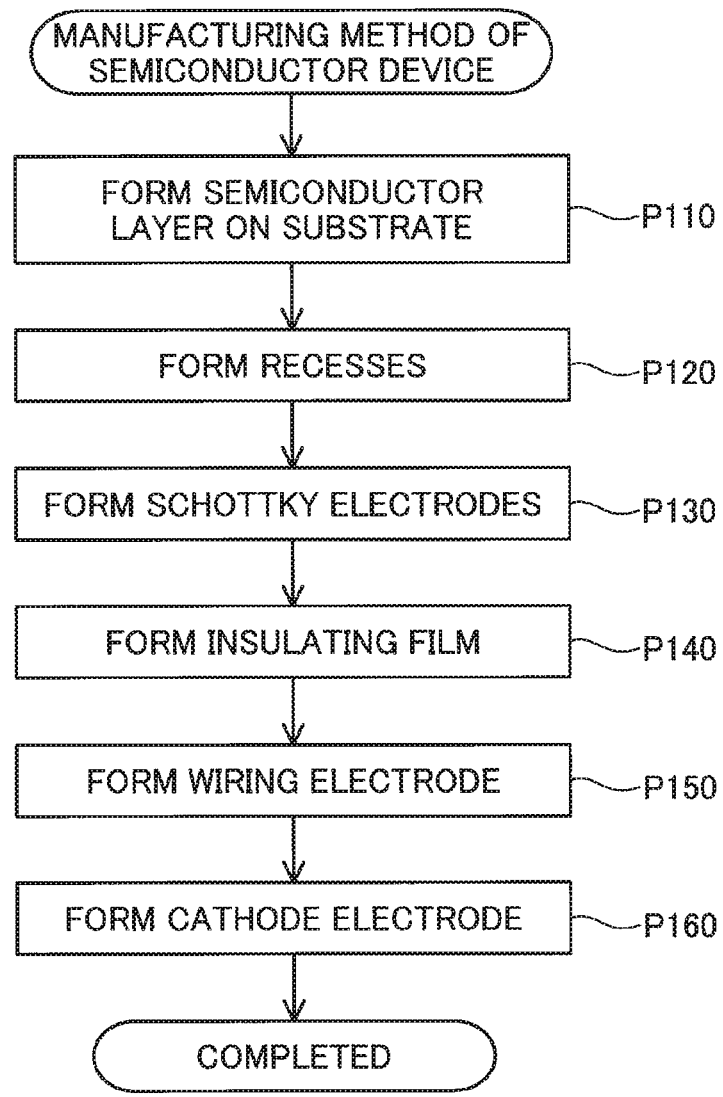
FIG. 3 is a process chart showing a manufacturing method of the semiconductor device according to the first embodiment.

FIG. 3 is a process chart showing a manufacturing method of the semiconductor device 100 according to the first embodiment. The manufacturer first forms the semiconductor layer 120 on the substrate 110 (process P110). According to the embodiment, the manufacturer forms the semiconductor layer 120 on the +Z-axis direction side face of the substrate 110 by metal organic chemical vapor deposition (MOCVD). According to the embodiment, the semiconductor layer 120 has a thickness (length in the Z-axis direction) of 10 µm and a donor concentration of $1.0 \times 10^{16}$ $cm^{-3}$.

After forming the semiconductor layer 120 (process P110), the manufacturer forms the recesses 125 (process P120). According to the embodiment, the manufacturer deposits silicon dioxide ($SiO_2$) by plasma-enhanced chemical vapor deposition (plasma CVD). The manufacturer subsequently forms a resist pattern of photoresist on the layer of silicon dioxide ($SiO_2$), and removes the layer of silicon dioxide ($SiO_2$) other than portions covered with the photoresist by carbon fluoride (CF)-based dry etching. The manufacturer subsequently etches the semiconductor layer 120 to form the plurality of recesses 125 by chlorine (Cl)-based dry etching with the layer of silicon dioxide ($SiO_2$) as an etching mask. This embodiment uses silicon dioxide ($SiO_2$) as the etching mask. The etching mask is, however, not limited to this embodiment but may be, for example, a photoresist. A modified procedure may additionally perform wet etching of the etched surface using an alkali solution after dry etching. This removes the damaged layer of the etched surface and accordingly suppresses an increase of leak current at a reverse voltage.

After forming the recesses 125 (process P120), the manufacturer forms the Schottky electrodes 140 (process P130). According to the embodiment, the manufacturer forms a layer made of nickel (Ni) (thickness; 100 nm) and a layer made of palladium (Pd) (thickness; 100 nm) in this sequence on the surface S of the semiconductor layer 120 by electron beam evaporation using a lift-off method. More specifically, the manufacturer forms a resist pattern by photolithography and subsequently forms the Schottky electrodes 140 by electron beam evaporation. For example, resistive heating evaporation or sputtering may be employed in place of electron beam deposition. A method of forming a metal layer on the entire +Z-axis direction side face of the semiconductor layer 120, subsequently forming a resist pattern by photolithography and then performing etching, ion milling or the like may be employed in place of the lift-off method.

After forming the Schottky electrodes 140 (process P130), the manufacturer forms the insulating film 130 (process P140). According to the embodiment, the manufacturer causes (i) a layer of aluminum oxide ($Al_2O_3$) (thickness; 100 nm) to deposit on the semiconductor layer 120 and the Schottky electrodes 140 by ALD (atomic layer deposition); and (ii) a layer of silicon dioxide ($SiO_2$) (thickness; 500 nm) to deposit on the layer of aluminum oxide ($Al_2O_3$) by plasma CVD (plasma-enhanced chemical vapor deposition). The manufacturer subsequently forms a resist pattern of photoresist on the layer of silicon dioxide ($SiO_2$) and forms the openings 135 on the Schottky electrodes 140 by hydrofluoric acid (HF)-based wet etching. The etching technique employed here is not limited to hydrofluoric acid (HO-based wet etching but may be, for example, reactive ion etching that is classified as a dry etching technique or a combination of wet etching and dry etching.

After forming the insulating film 130 (process P140), the manufacturer forms the wiring electrode 160 (process P150). According to the embodiment, the manufacturer forms a layer of titanium nitride (TiN) (thickness; 35 nm) and a layer of aluminum silicon (AlSi) (thickness; 1000 nm) in this sequence on the entire exposed faces of the insulating film 130 and the Schottky electrodes 140 by sputtering. The manufacturer subsequently forms a resist pattern of photoresist. The resist pattern is formed to surround the surface S of the semiconductor layer 120. The manufacturer then removes the layers of TiN and AlSi other than portions covered with the photoresist by chlorine (Cl)-based dry etching. Titanium nitride (TiN) of the wiring electrode 160 serves as the barrier metal to prevent mutual diffusion of the electrode materials between the electrode layers. Aluminum silicon (AlSi) of the wiring electrode 160 serves to reduce the electric resistance in the wiring electrode 160.

After forming the wiring electrode 160 (process P150), the manufacturer forms the cathode electrode 150 (process P160). More specifically, the manufacturer forms the cathode electrode 150 on the entire rear face (−Z-axis direction side face) of the substrate 110. The semiconductor device 100 is completed through this series of processes.

A-3. Advantageous Effect

In the semiconductor device 100 of the first embodiment described above, when the semiconductor layer 120 is viewed from the surface S-side, the surface of the semiconductor layer 120 is arranged continuously, and the distances d1 on the surface S between adjacent recesses 125 are substantially identical. This configuration of the semiconductor device 100 of the first embodiment suppresses the photoresist from being left in any unintended portion. The following shows the results of an evaluation test supporting this advantageous effect.

A-4. Test Results and Others

Figure 4:
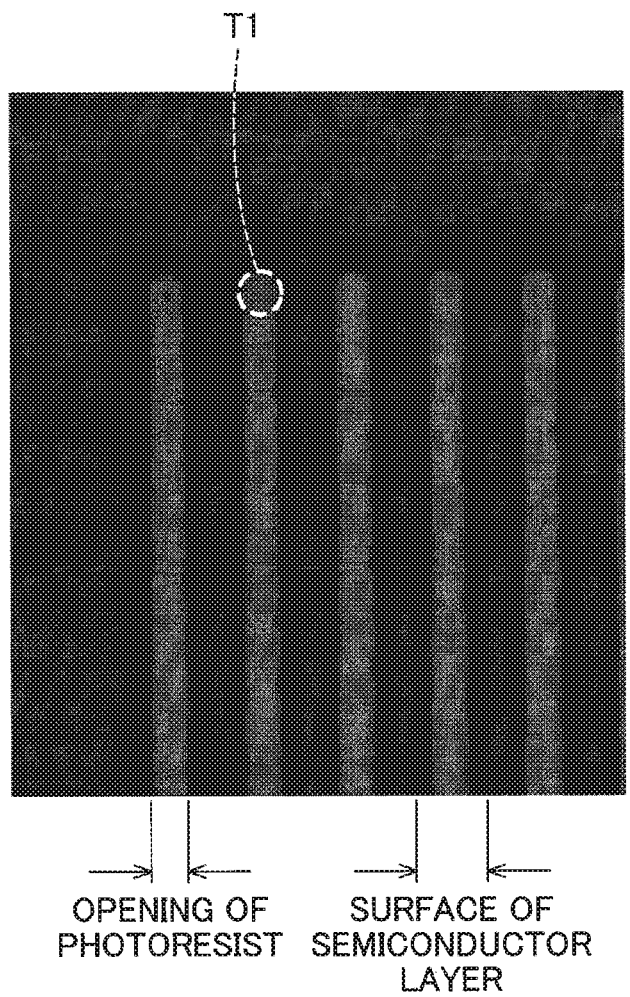
FIG. 4 is a diagram illustrating a result of an evaluation test.
Figure 5:
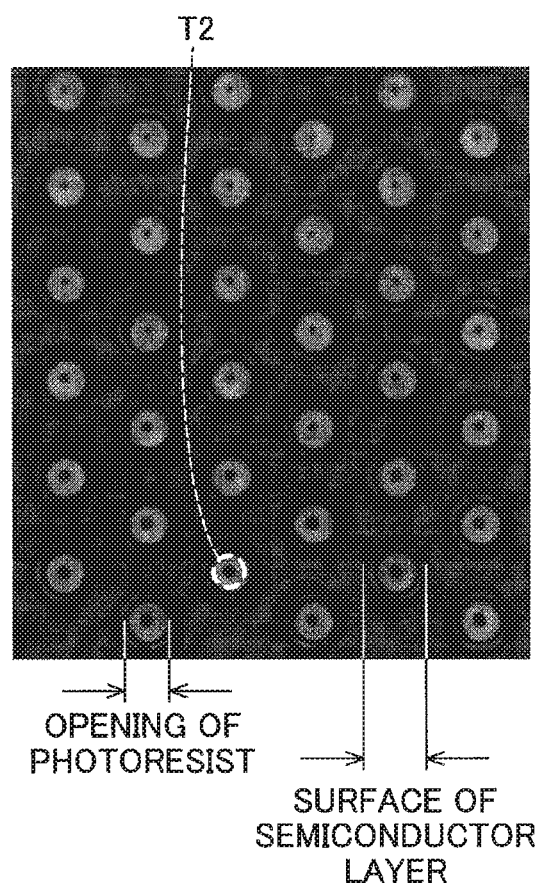
FIG. 5 is a diagram illustrating a result of the evaluation test.
Figure 6:
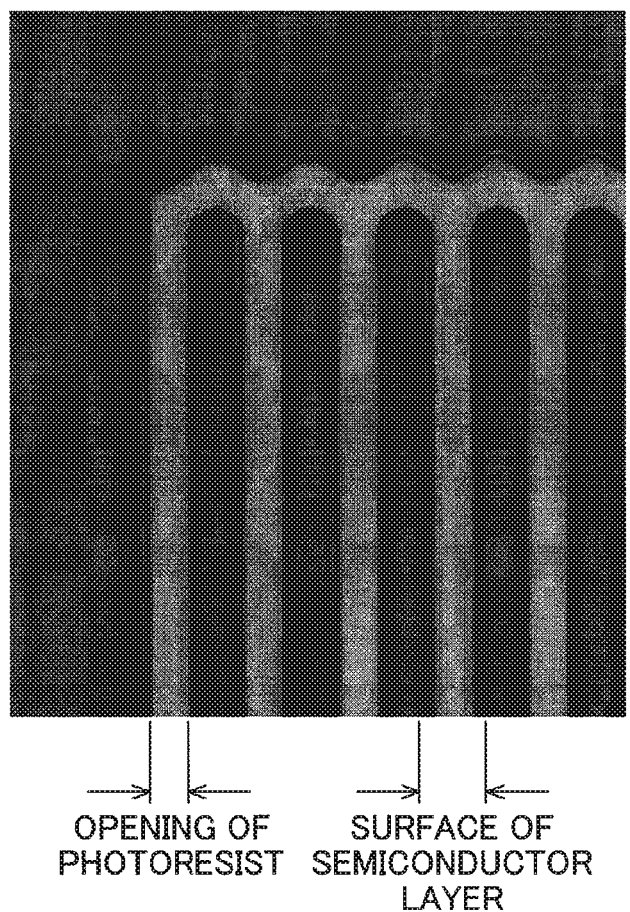
FIG. 6 is a diagram illustrating a result of the evaluation test.

FIGS. 4 to 6 are diagrams illustrating the results of an evaluation test. FIGS. 4 to 6 are images taken with an optical microscope after formation of the recesses 125 and subsequent formation of a resist pattern in the process of forming the Schottky electrodes 140. In FIGS. 4 to 6, black portions indicate portions where the photoresist is formed, and white portions indicate openings without formation of the photoresist. A surface of a semiconductor layer is formed to surround the openings of the photoresist.

FIGS. 4 and 5 show comparative examples, and FIG. 6 shows an example according to the embodiment. More specifically, in the comparative example of FIG. 4, the surface of the semiconductor layer surrounded by the recess is formed in a rectangular shape with two semicircular opposed short sides. In the comparative example of FIG. 5, the surface of the semiconductor layer is formed in a hexagonal shape. In the example of FIG. 6, the recess surrounded by the surface is formed in a rectangular shape with two semicircular opposed short sides, as described in the above embodiment.

In the comparative example of FIG. 4, the photoresist is left in a region T1 on the surface of the semiconductor layer. In the comparative example of FIG. 5, the photoresist is left in a region T2 on the surface of the semiconductor layer. In the example of FIG. 6, on the other hand, no photoresist is left on the surface of the semiconductor layer. As described above, the structure according to the above embodiment suppresses the photoresist from being left in any unintended portion, whereas the other structures are likely to cause the photoresist to be left in an unintended portion. The following describes a presumed mechanism of this phenomenon.

Figure 7:
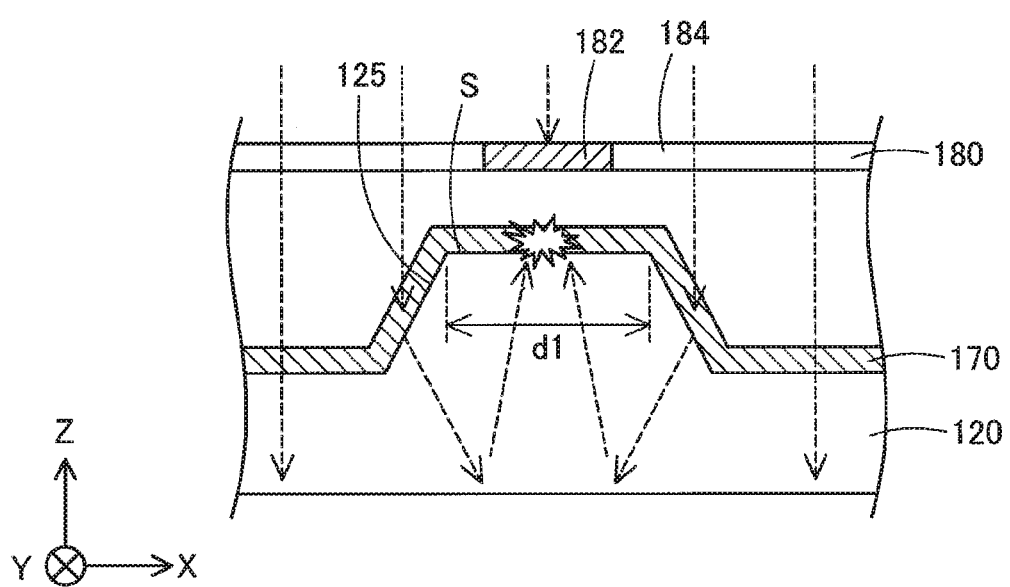
FIG. 7 is a diagram illustrating the state of exposure in photolithography.

FIG. 7 is a diagram illustrating the state of exposure in photolithography. In FIG. 7, an entire upper face of the semiconductor layer 120 is covered with a negative photoresist 170. The negative photoresist 170 is irradiated with light in the state that a mask 180 including light-shielding portions 182 by which light is blocked and light-transmitting portions 184 through which light is transmitted is placed above the negative photoresist 170.

The negative photoresist 170 is generally left in regions exposed to the light transmitted through the light-transmitting portions 184 of the mask 180, and is not left in regions shielded from the light by the light-shielding portions 182 of the mask 180. As shown in FIG. 7, however, the lights transmitted through the light-transmitting portions 184 of the mask 180 are refracted and reflected by the semiconductor layer 120 to interfere with each other. This causes the negative photoresist 170 to be exposed to the light and to be left in a specific part of the regions shielded from the light by the light-shielding portions 182 of the mask 180. This phenomenon is especially remarkable in the portion of the semiconductor layer surrounded by the side face of the recess.

Figure 8:
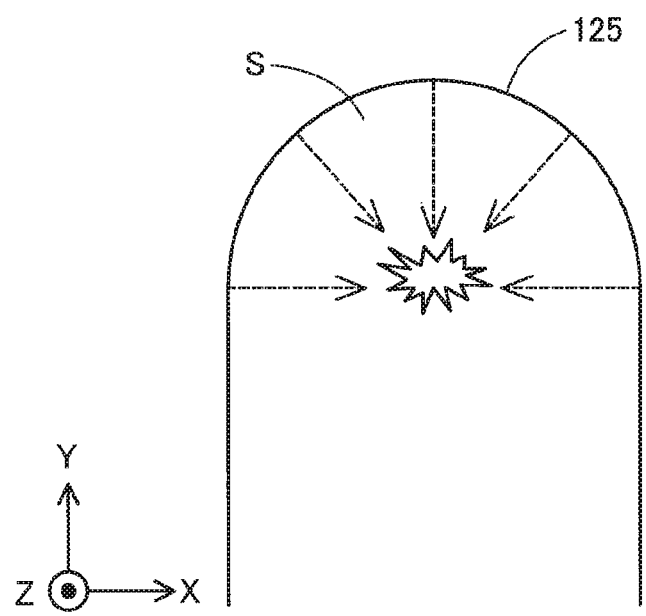
FIG. 8 is a diagram illustrating an end of a surface of a semiconductor layer surrounded by a recess.
Figure 9:
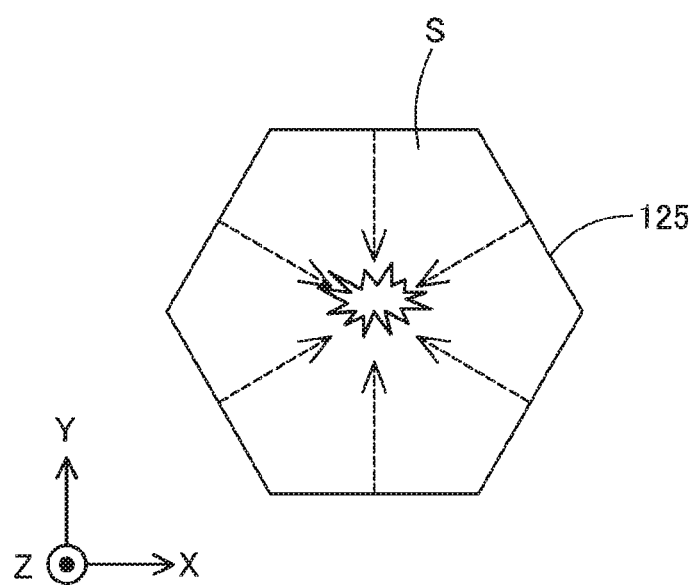
FIG. 9 is a diagram illustrating a portion where a photoresist is left.

FIGS. 8 and 9 are diagrams illustrating portions where a photoresist is left. FIGS. 8 and 9 illustrate the states when a semiconductor layer is viewed from its surface side. FIG. 8 is a diagram illustrating an end of a surface of a semiconductor layer surrounded by a recess. FIG. 9 is a diagram illustrating a hexagonal surface of a semiconductor layer surrounded by a recess. In the example of FIG. 8, the refracted and reflected lights are likely to be focused in the vicinity of the center of a semicircular portion of the surface of the semiconductor layer. In the example of FIG. 9, the refracted and reflected lights are likely to be focused in the vicinity of the center of a hexagonal portion of the surface of the semiconductor layer.

Figure 10:
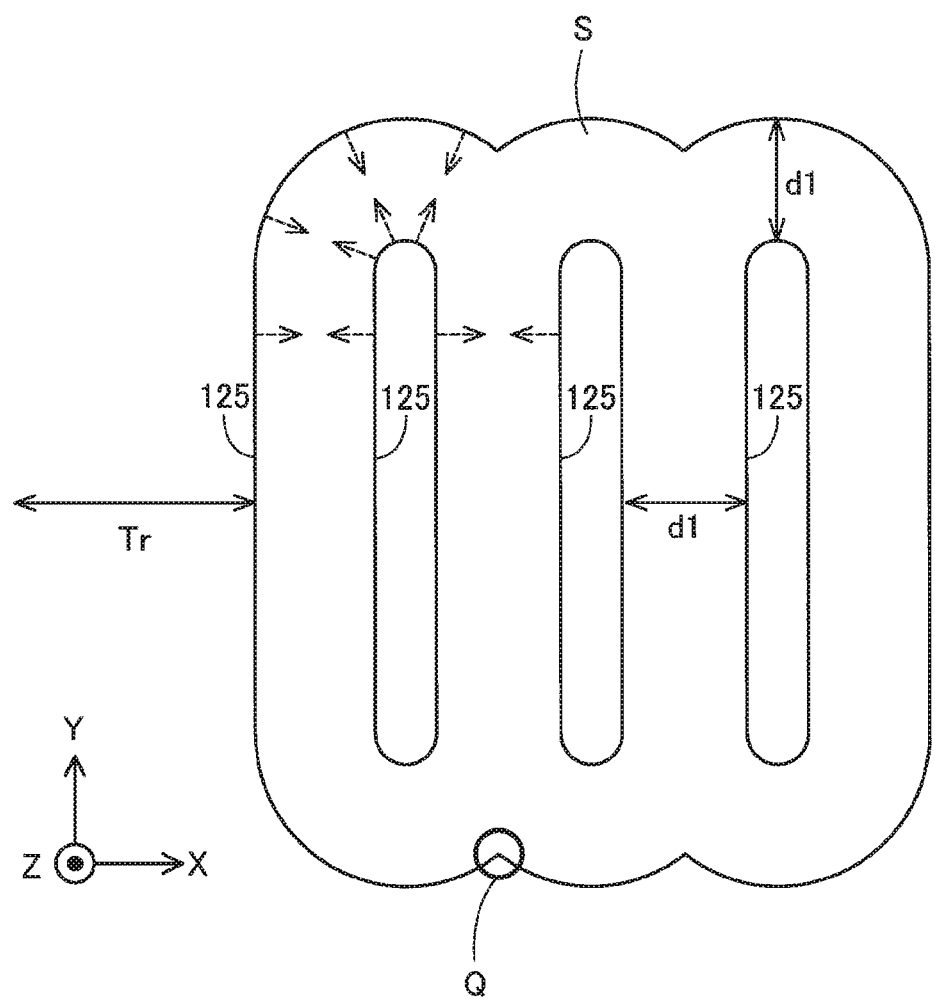
FIG. 10 is a diagram illustrating the state of exposure in photolithography according to the embodiment.

FIG. 10 is a diagram illustrating the state of exposure in photolithography according to the embodiment. In the semiconductor device 100 of the embodiment, when the semiconductor layer 120 is viewed from the surface S-side, the surface S of the semiconductor layer 120 is arranged continuously, and the distances d1 on the surface S between adjacent recesses 125 are substantially identical. This configuration suppresses the refracted and reflected lights from being focused in a specific part. As a result, the configuration of the semiconductor device 100 of the embodiment suppresses the photoresist from being left in any unintended portion.

Figure 11:
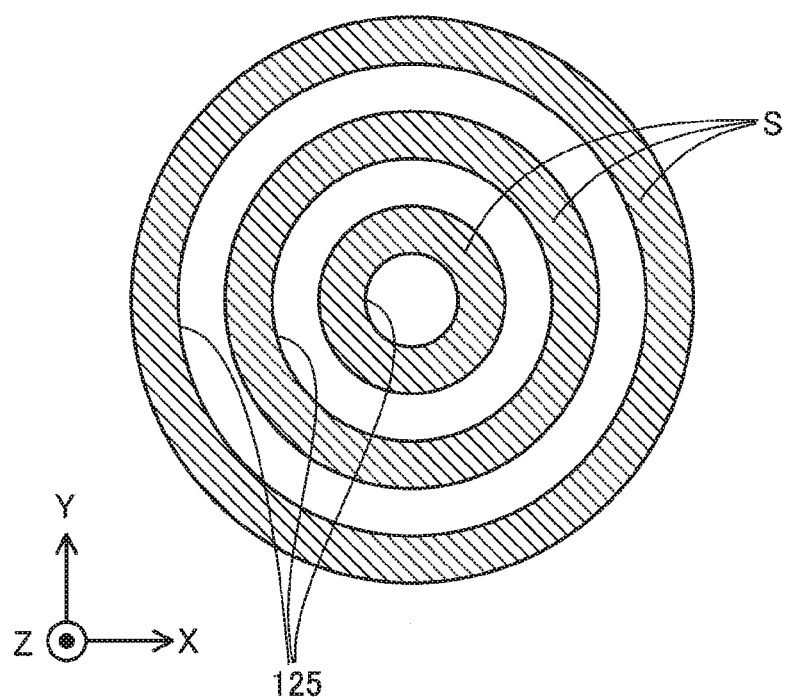
FIG. 11 is a diagram illustrating a comparative example where a surface of a semiconductor layer is discontinuous.

FIG. 11 is a diagram illustrating a comparative example where a surface S of a semiconductor layer 120 is discontinuous. In FIG. 11, the surface S of the semiconductor layer 120 is divided into three parts that are arranged concentrically, and recesses 125 are provided between the respective divisional parts of the surface S. Employing the structure shown in FIG. 11 provides substantially identical distances d1 on the surface between adjacent recesses 125 and thereby suppresses the refracted and reflected lights from being focused in a specific part. Employing the structure shown in FIG. 11, however, undesirably needs to form a wiring electrode across the recesses 125.

Figure 12:
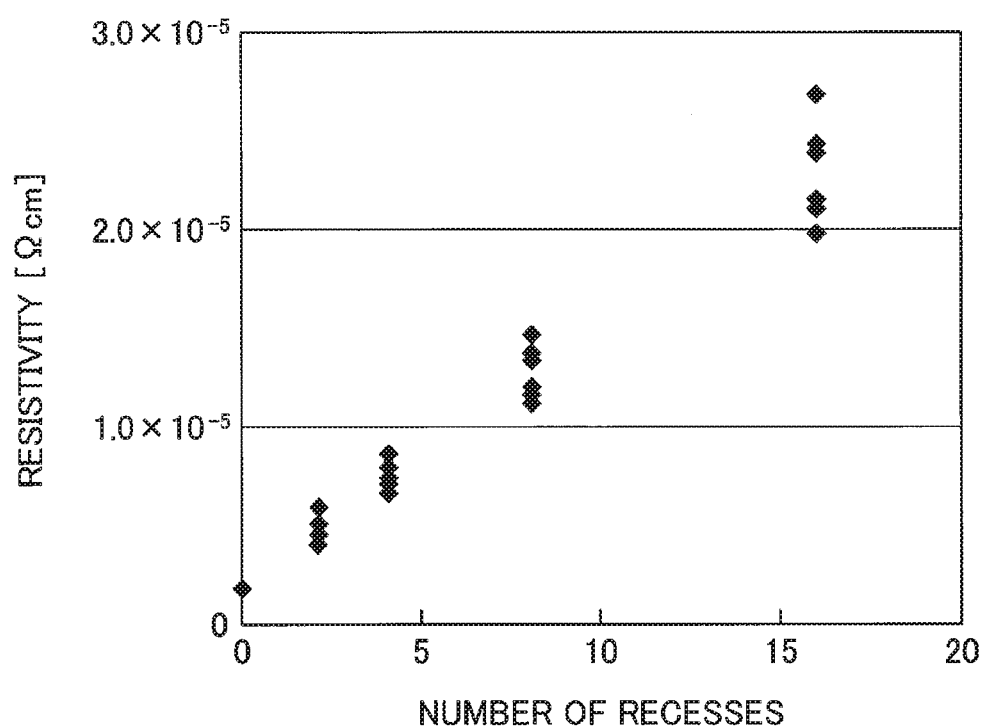
FIG. 12 is a graph showing a relationship between the number of recesses across which a wiring electrode is formed and the resistivity.

FIG. 12 is a graph showing a relationship between the number of recesses 125 across which a wiring electrode is formed and the resistivity. In FIG. 12, the ordinate shows the resistivity ($\Omega$cm), and the abscissa shows the number of the recesses 125 across which the wiring electrode is formed.

The results of FIG. 12 show that the resistivity of the wiring electrode increases with an increase in number of the recesses 125 across which the wiring electrode is formed. Compared with this comparative example, in the semiconductor device 100 of the embodiment, when the semiconductor layer 120 is viewed from the surface S-side, the surface S of the semiconductor layer 120 is arranged continuously. This configuration suppresses an increase in resistivity of the wiring electrode.

Figure 13:
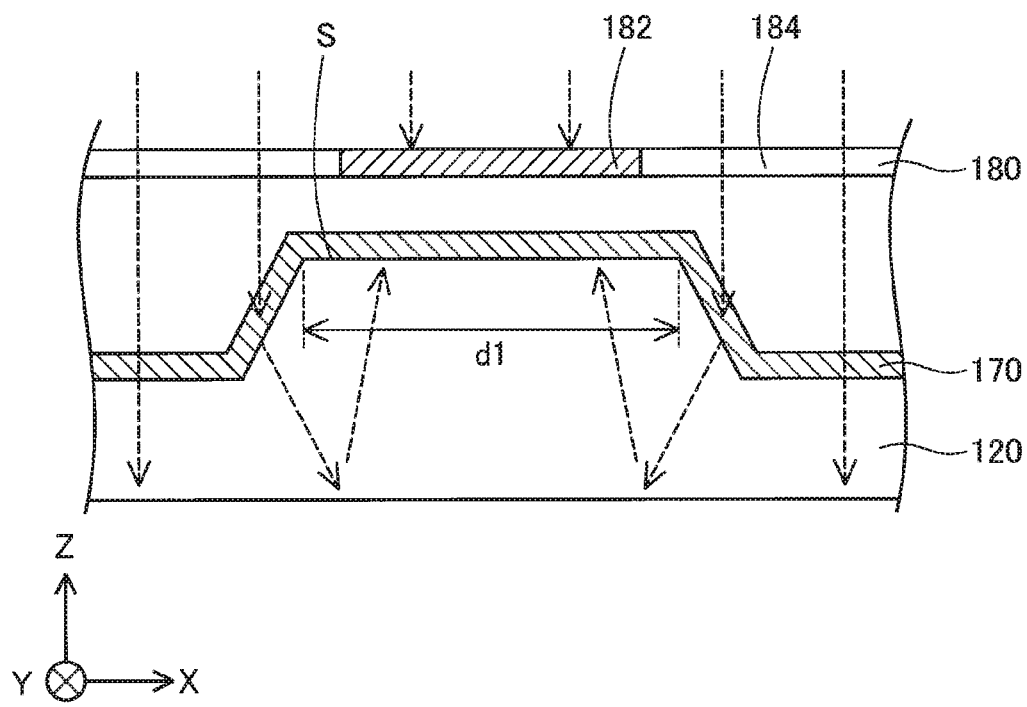
FIG. 13 is a diagram illustrating the effect of the longer distance on a surface between adjacent recesses.

FIG. 13 is a diagram showing the effect of the longer distance d1 on the surface S between adjacent recesses 125. FIG. 13 differs from FIG. 7 by the longer distance d1 on the surface S between adjacent recesses 125 but otherwise has a similar configuration. As shown in FIG. 13, an increase in distance d1 suppresses the refracted and reflected lights from focusing on a specific portion. The increase in distance d1 is, however, likely to increase the field intensity.

Figure 14:
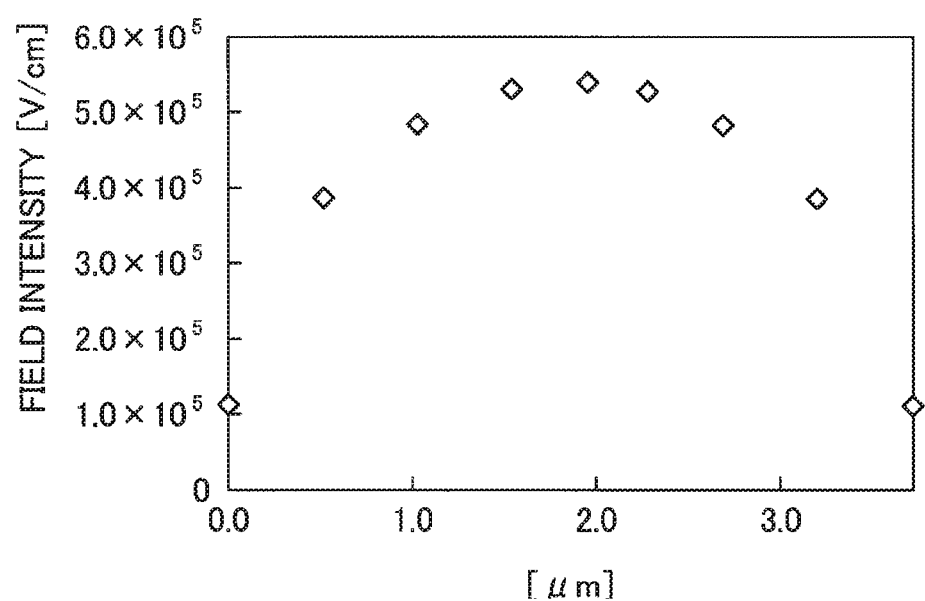
FIG. 14 is a graph showing a relationship between the distance and the field intensity.

FIG. 14 is a graph showing a relationship between the distance d1 and the field intensity. In FIG. 14, the ordinate shows the field intensity (V/cm), and the abscissa shows the distance from one end to the other end of the surface S. The results of FIG. 14 show that the field intensity is low at the respective ends of the surface S and increases from the respective ends toward the center. This means that the field intensity increases with an increase in distance d1. An increase in field intensity increases the leak current. In the semiconductor device 100 of the embodiment, in terms of reducing the field intensity, the distance d1 is preferably not greater than 15 μm, is more preferably not greater than 10 μm and is furthermore preferably not greater than 6 μm. Additionally, this embodiment is configured to provide the constant distance d1 at any locations by providing the bends Q. This configuration suppresses a variation in field intensity in the surface. This configuration also increases the length of the end of the surface S having the lower field intensity and reduces the field intensity as the entire element, compared with a configuration without such bends Q.

B. Other Embodiments

B1. Second Embodiment

Figure 15:
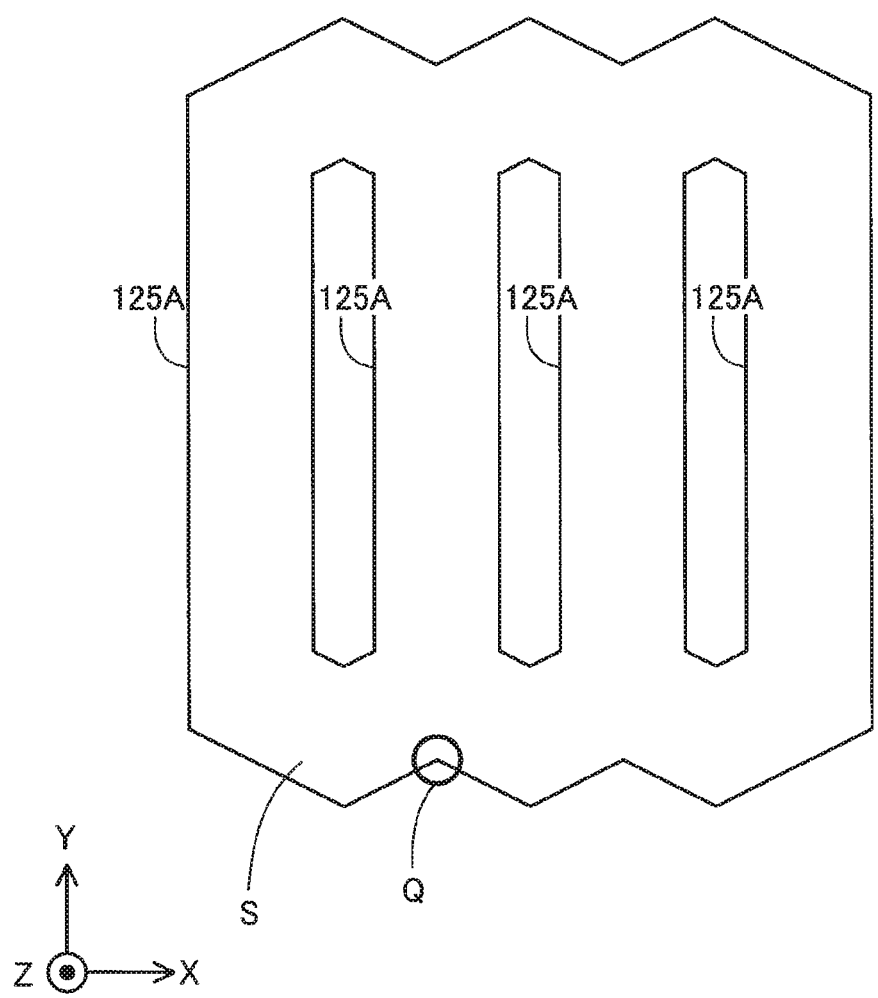
FIG. 15 is a diagram illustrating the configuration of recesses according to a second embodiment.

FIG. 15 is a diagram schematically illustrating the configuration of recesses 125A according to a second embodiment. The second embodiment differs from the first embodiment by the shape of the recesses 125A but otherwise has a similar configuration. According to the second embodiment, when the semiconductor layer 120 is viewed from the surface S-side, each of the recesses 125A surrounded by the surface S is formed in a hexagonal shape.

B2. Third Embodiment

Figure 16:
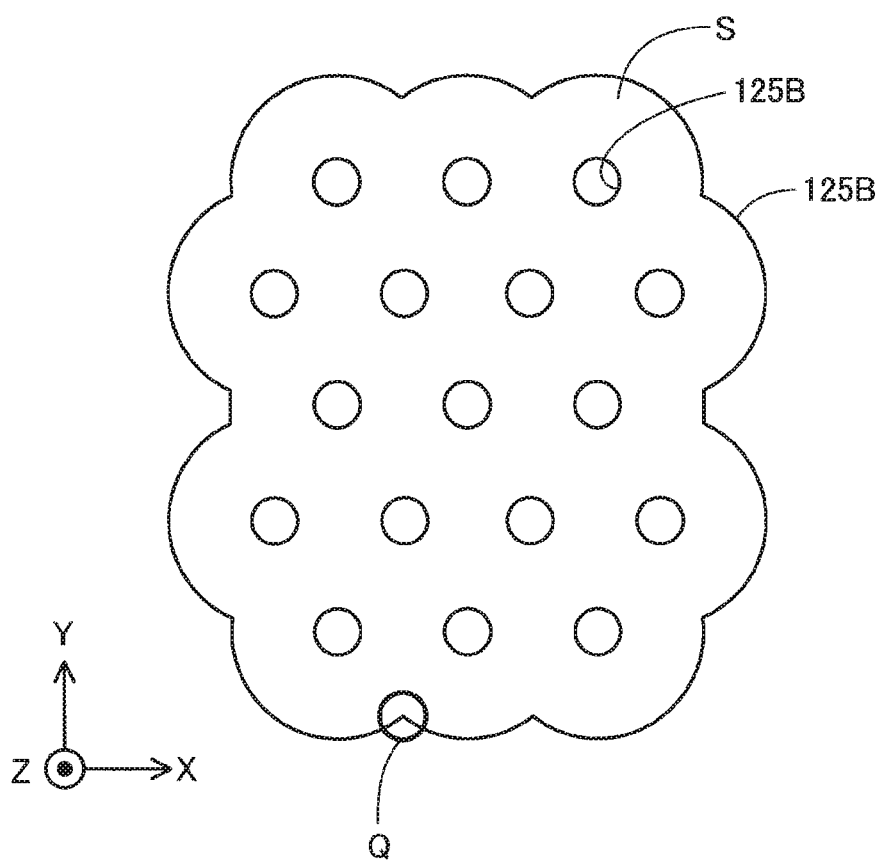
FIG. 16 is a diagram illustrating the configuration of recesses according to a third embodiment.

FIG. 16 is a diagram illustrating the configuration of recesses 125B according to a third embodiment. The third embodiment differs from the first embodiment by the shape of the recesses 125B but otherwise has a similar configuration.

According to the third embodiment, each of the recesses 125B surrounded by the surface S is formed in a circular shape. According to the third embodiment, when the semiconductor layer 120 is viewed from the surface S-side, centers of the plurality of recesses 125B surrounded by the surface S are arrayed in a rhombic lattice arrangement. The state that "the plurality of recesses 125B surrounded by the surface S are arrayed in the rhombic lattice arrangement" means that the recesses 125B are arrayed at equal intervals on each of lines that are arranged at equal intervals and that the respective lines are alternately shifted by half the interval of the arrangement. The rhombic lattice arrangement of the recesses 125B surrounded by the surface S in the semiconductor device of the third embodiment improves the area ratio of the surface S to the entire semiconductor device and thereby reduces the on-resistance, compared with the semiconductor device of the first embodiment.

B3. Fourth Embodiment

Figure 17:
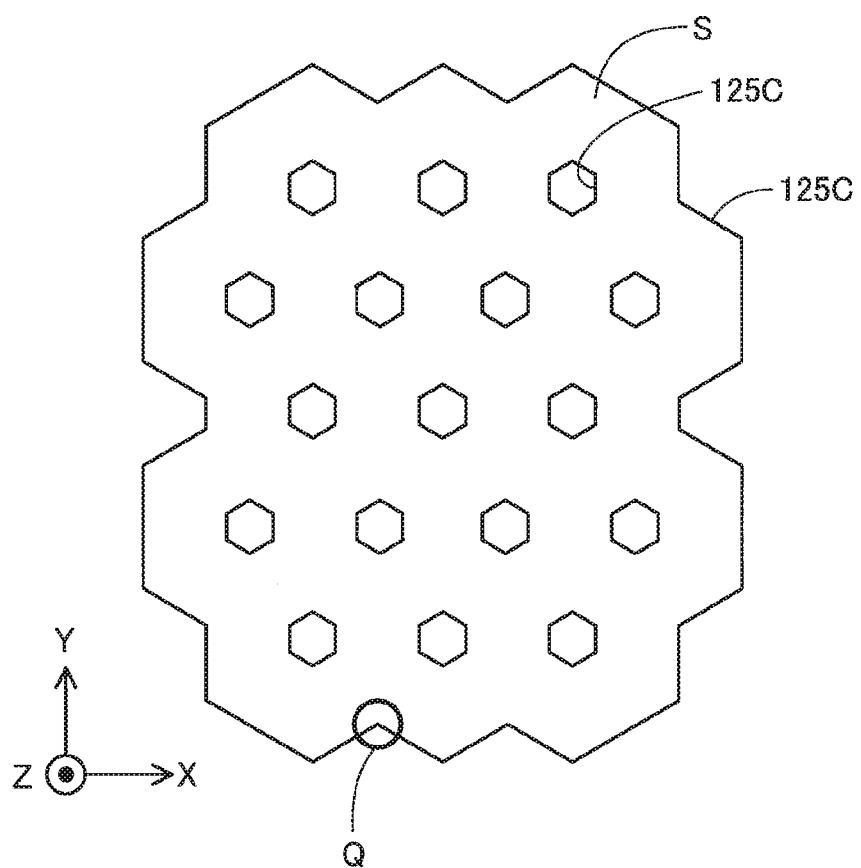
FIG. 17 is a diagram illustrating the configuration of recesses according to a fourth embodiment.

FIG. 17 is a diagram illustrating the configuration of recesses 125C according to a fourth embodiment. The fourth embodiment differs from the third embodiment by the shape of the recesses 125C but otherwise has a similar configuration. According to the fourth embodiment, each of the recesses 125C surrounded by the surface S is formed in a hexagonal shape.

B4. Fifth Embodiment

Figure 18:
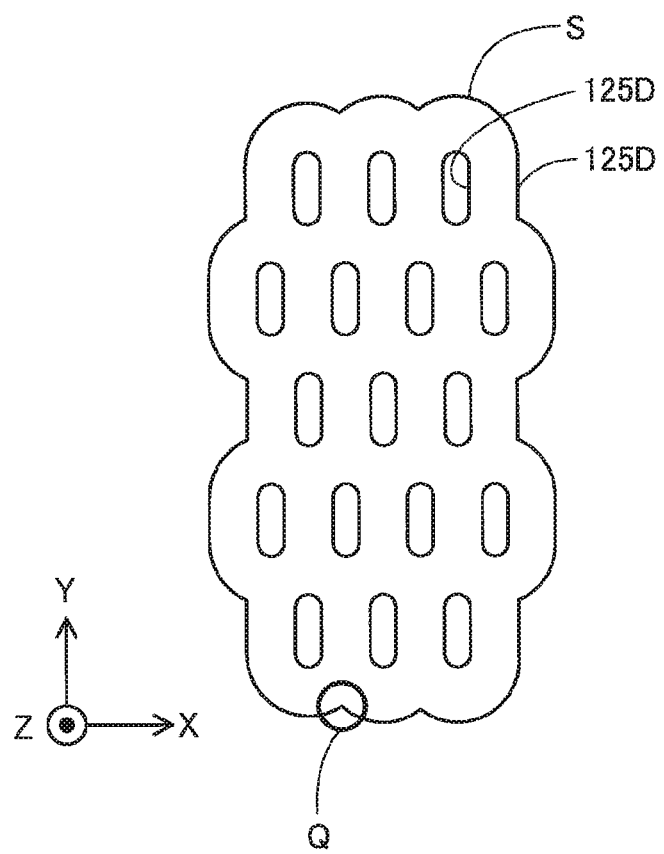
FIG. 18 is a diagram illustrating the configuration of recesses according to a fifth embodiment.

FIG. 18 is a diagram illustrating the configuration of recesses 125D according to a fifth embodiment. The fifth embodiment differs from the fourth embodiment by the shape of the recesses 125D but otherwise has a similar configuration. According to the fifth embodiment, each of the recesses 125D surrounded by the surface S is formed in a rectangular shape with two semicircular opposed short sides. In a semiconductor device of the fifth embodiment, the recess 125D surrounded by the surface S has longer sides, unlike a semiconductor device of the fourth embodiment. This facilitates fine patterning in formation of the recesses 125D by photolithography and thereby facilitates manufacture of the semiconductor device of the fifth embodiment, compared with the semiconductor device of the fourth embodiment.

B5. Sixth Embodiment

Figure 19:
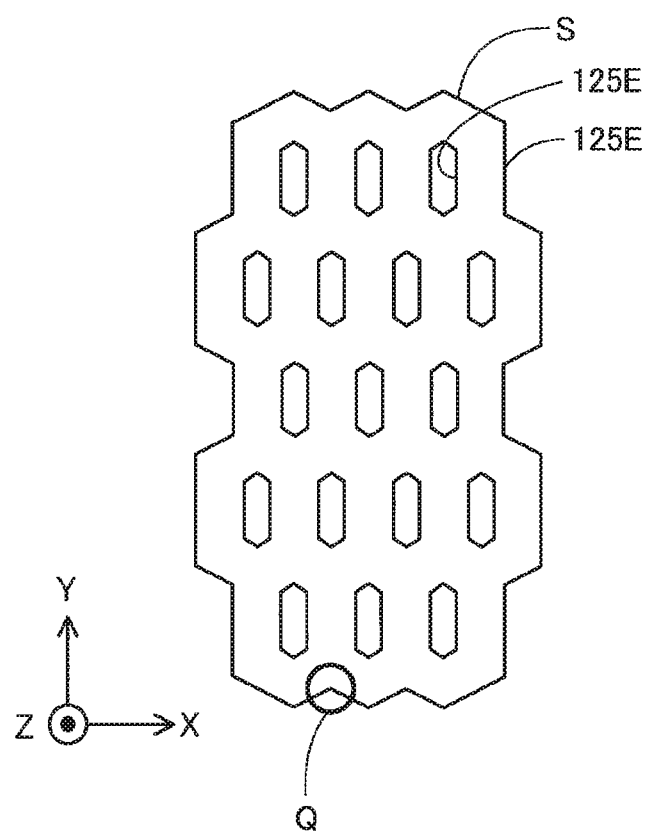
FIG. 19 is a diagram illustrating the configuration of recesses according to a sixth embodiment.
Figure 20:
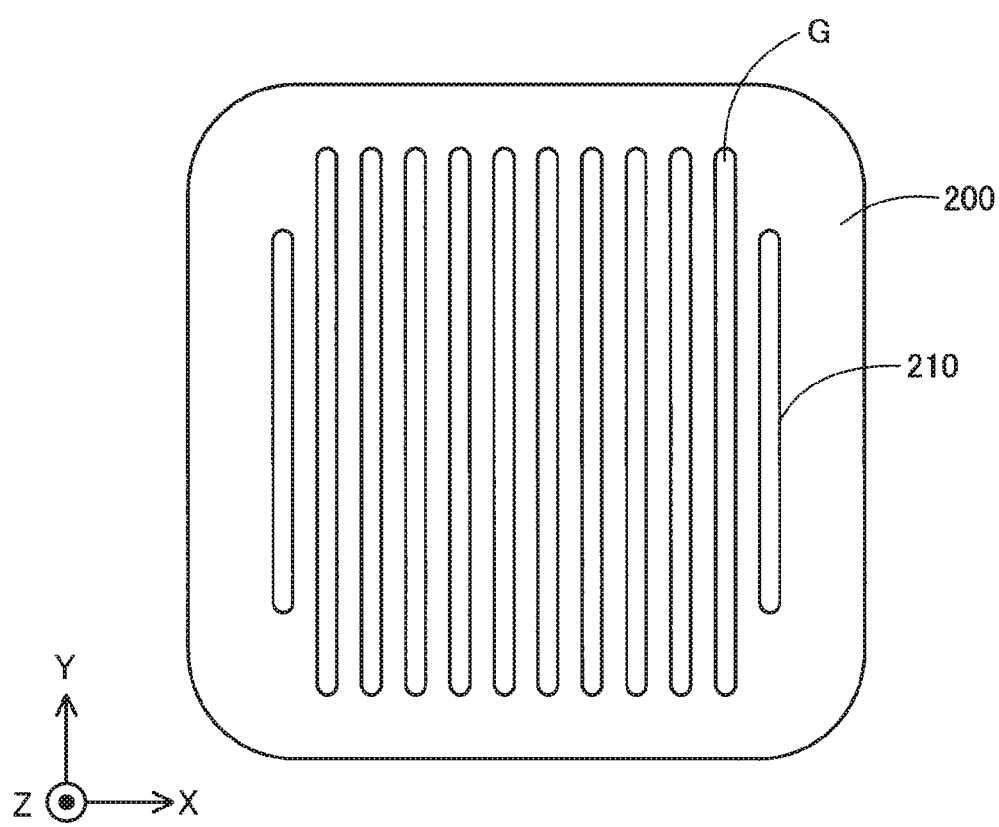
FIG. 20 is a diagram illustrating the configuration of trenches described in JP2014-116471A.

FIG. 19 is a diagram illustrating the configuration of recesses 125E according to a sixth embodiment. The sixth embodiment differs from the fifth embodiment by the shape of the recesses 125E but otherwise has a similar configuration. According to the sixth embodiment, each of the recesses 125E surrounded by the surface S is formed in a hexagonal shape having two opposed sides longer than the other sides.

C. Modifications

In the above embodiments, the material of the substrate and the semiconductor layer is not limited gallium nitride (GaN), but may be, for example, sapphire ($Al_2O_3$), silicon (Si), silicon carbide (SiC), gallium oxide ($Ga_2O_3$), gallium arsenide (GaAs) or diamond (C).

In the above embodiments, the materials of the respective electrodes are not limited to the materials described in the above embodiments but may be other materials. For example, nickel (Ni) and palladium (Pd) are used as the materials of the Schottky electrode 140. The Schottky electrode 140 is, however, not limited to this configuration but may have a multi-layered structure by additionally using another material such as platinum (Pt) or iridium (Ir) in combination or may have a single-layered structure of nickel (Ni), palladium (Pd), platinum (Pt) or iridium (Ir).

According to the above embodiments, titanium nitride (TiN) and aluminum silicon (AlSi) are used as the materials of the wiring electrode 160. The wiring electrode 160 is, however, not limited to this configuration. The wiring electrode 160 may have a multi-layered structure by additionally using another material such as copper (Cu) or gold (Au) in combination or may have a single-layered structure of titanium nitride (TiN), aluminum silicon (AlSi), copper (Cu) or gold (Au). The wiring electrode 160 may have a multi-layered structure by further using a material such as tungsten (W), vanadium (V), tantalum (Ta) or molybdenum (Mo) in combination as the barrier metal.

According to the above embodiments, silicon dioxide ($SiO_2$) and aluminum oxide ($Al_2O_3$) are used as the materials of the insulating film 130. The insulating film 130 is, however, not limited to this configuration. The insulating film 130 may have a single-layered structure or may have another multi-layered structure. The material of the insulating film 130 may be, for example, silicon dioxide ($SiO_2$), silicon nitride (SiN), aluminum oxide ($Al_2O_3$), aluminum oxynitride (AlON), zirconium oxide ($ZrO_2$), zirconium oxynitride (ZrON), silicon oxynitride (SiON) and hafnium oxide ($HfO_2$).

The disclosure is not limited to any of the embodiment, the examples, and the modifications described above but may be implemented by a diversity of other configurations without departing from the scope of the disclosure. For example, the technical features of any of the embodiment, the examples and the modifications corresponding to the technical features of each of the aspects described in SUMMARY may be replaced or combined appropriately, in order to solve part or all of the problems described above or in order to achieve part or all of the advantageous effects described above. Any of the technical features may be omitted appropriately unless the technical feature is described as essential herein.

What is claimed is:

1. A Schottky barrier diode, comprising:
a semiconductor layer configured to include a surface and a plurality of recesses that are recessed relative to the surface; and
a Schottky electrode arranged to form a Schottky contact with the surface,
wherein, when the semiconductor layer is viewed from a surface side thereof:
the surface is arranged continuously;
distances on the surface between adjacent recesses of the recesses are substantially identical; and
side walls of a recess of the recesses, located on an outer periphery of the surface, include bends that are bent to provide the substantially identical distances between the adjacent recesses.

2. The Schottky barrier diode according to claim 1, wherein, when the semiconductor layer is viewed from the surface side, another recess of the recesses, surrounded by the surface, is formed in a circular shape or in a four-side shape with two semicircular opposed sides.

3. The Schottky barrier diode according to claim 1, wherein, when the semiconductor layer is viewed from the surface side, another recess of the recess, surrounded by the surface, is formed in a hexagonal shape.

4. The Schottky barrier diode according to claim 1, wherein, when the semiconductor layer is viewed from the surface side, centers of multiple recesses of the recesses, surrounded by the surface, are arrayed in a rhombic lattice arrangement.

5. The Schottky barrier diode according to claim 1, wherein, when the semiconductor layer is viewed from the surface side, multiple recesses of the recesses, surrounded by the surface, are parallel to each other in a first direction and are arrayed in a line in a second direction perpendicular to the first direction.

6. The Schottky barrier diode according to claim 1, wherein the distances on the surface between the adjacent recesses are not less than 1.0 μm and not greater than 15 μm.

7. The Schottky barrier diode according to claim 1, wherein an angle between a bottom face and a side wall of the recess the recesses is not less than 85 degrees and not greater than 90 degrees.

8. The Schottky barrier diode according to claim 1, wherein the recesses have a depth of not less than 0.1 μm and not greater than 5.0 μm.

9. The Schottky barrier diode according to claim 1, wherein a distance between an end of the Schottky electrode and a side wall of the recess of the recesses is not greater than 2.0 μm.

10. The Schottky barrier diode according to claim 1, wherein the Schottky electrode comprises at least one selected from a group consisting of nickel, palladium, platinum, and iridium.

11. The Schottky barrier diode according to claim 1, wherein the semiconductor layer comprises gallium nitride.

12. The Schottky barrier diode according to claim 1, wherein, when the semiconductor layer is viewed from the surface side, the recesses space apart portions of the Schottky electrode from each other on the surface.

13. The Schottky barrier diode according to claim 1, further comprising:
an insulating film disposed, between the adjacent recesses, on the surface.

14. The Schottky barrier diode according to claim 13, wherein the insulating film is further disposed on a surface of the Schottky electrode.

15. The Schottky barrier diode according to claim 1, wherein, when the semiconductor layer is viewed from the surface side, an entirety of the Schottky electrode is located outside the recesses.

16. The Schottky barrier diode according to claim 1, wherein the Schottky electrode discontinuously extends, on the surface, on opposing sides of another recess of teh recesses.

17. The Schottky barrier diode according to claim 1, wherein the bends are located on the outer periphery of the surface on a side of a terminal region surrounding an element region, and are configured to be bent toward the terminal region between the adjacent recesses to provide the substantially identical distances between the adjacent recesses.

18. The Schottky barrier diode according to claim 1, wherein the outer periphery of the surface includes a terminal region where a terminal structure of a semiconductor device is formed.

19. The Schottky barrier diode according to claim 18, wherein the terminal region surrounds an element region.

20. The Schottky barrier diode according to claim 19, wherein the surface is located in the element region.

* * * * *